United States Patent
Hu

(10) Patent No.: US 10,535,622 B2
(45) Date of Patent: Jan. 14, 2020

(54) SUBSTRATE STRUCTURE AND ELECTRONIC DEVICE HAVING COARSE REDISTRIBUTION LAYER ELECTRICALLY CONNECTED TO FINE REDISTRIBUTION LAYER

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 16/188,311

(22) Filed: Nov. 13, 2018

(65) Prior Publication Data

US 2019/0181112 A1 Jun. 13, 2019

Related U.S. Application Data

(60) Provisional application No. 62/596,068, filed on Dec. 7, 2017.

(30) Foreign Application Priority Data

Sep. 26, 2018 (TW) .............................. 107133917 A

(51) Int. Cl.
*H01L 23/522* (2006.01)
*H01L 23/00* (2006.01)
(Continued)

(52) U.S. Cl.
CPC ............ *H01L 24/20* (2013.01); *H01L 21/486* (2013.01); *H01L 21/4857* (2013.01);
(Continued)

(58) Field of Classification Search
CPC ........... H01L 23/49838; H01L 23/4985; H01L 23/5226; H01L 23/5283; H01L 23/5383; H01L 23/5384; H01L 23/5386; H01L 23/5387; H01L 24/20; H01L 24/25; H01L 25/167; H01L 2224/2201;
(Continued)

(56) References Cited

U.S. PATENT DOCUMENTS 10,002,852 B1 * 6/2018 Hu ...................... H01L 21/6835
10,037,946 B2 * 7/2018 Hu ...................... H01L 23/5386
(Continued)

FOREIGN PATENT DOCUMENTS

TW    I570842    2/2017

OTHER PUBLICATIONS

"Office Action of Taiwan Counterpart Application," dated Nov. 19, 2019, p. 1-p. 5.

*Primary Examiner* — Stephen W Smoot
(74) *Attorney, Agent, or Firm* — JCIPRNET

(57) ABSTRACT

A substrate structure includes a first portion, a second portion, and an intermedia portion disposed between the first and the second portion and the electrically connected business. The first portion includes a first fine redistribution layer (RDL) and a first coarse RDL. The first coarse RDL includes a first coarse conductive pattern, electrically connected to the first fine conductive pattern, where a, the first coarse RDL includes a first coarse conductive pattern Layout density of the first fine conductive pattern is denser than that of the first coarse conductive pattern. The second portion includes at least one of a second fine RDL and a second coarse RDL. An electronic device including a substrate structure is also provided.

18 Claims, 13 Drawing Sheets

(51) Int. Cl.
  *H01L 27/146* (2006.01)
  *H01L 23/538* (2006.01)
  *H01L 21/48* (2006.01)
  *H01L 25/16* (2006.01)
  *H01L 23/528* (2006.01)
  *H01L 23/498* (2006.01)

(52) U.S. Cl.
  CPC ...... *H01L 23/4985* (2013.01); *H01L 23/5226* (2013.01); *H01L 23/5283* (2013.01); *H01L 23/5383* (2013.01); *H01L 23/5384* (2013.01); *H01L 23/5386* (2013.01); *H01L 23/5387* (2013.01); *H01L 24/19* (2013.01); *H01L 25/167* (2013.01); *H01L 27/14618* (2013.01); *H01L 27/14627* (2013.01); *H01L 27/14636* (2013.01); *H01L 27/1462* (2013.01); *H01L 2224/16225* (2013.01); *H01L 2224/214* (2013.01); *H01L 2924/12041* (2013.01); *H01L 2924/12042* (2013.01); *H01L 2924/12043* (2013.01); *H01L 2924/146* (2013.01); *H01L 2924/1431* (2013.01); *H01L 2924/15311* (2013.01)

(58) Field of Classification Search
  CPC ....... H01L 2224/2205; H01L 2224/221; H01L 2224/224; H01L 2224/2501; H01L 2224/2505; H01L 2224/251; H01L 2224/254; H01L 2924/146; H01L 2924/1517; H01L 2924/152; H01L 2924/1533
  See application file for complete search history.

(56) References Cited

U.S. PATENT DOCUMENTS

2015/0357276 A1* 12/2015 Shimizu ............ H01L 23/49822
                                                              361/783
2016/0027712 A1*  1/2016 Hu ..................... H01L 23/12
                                                              174/262
2017/0018468 A1*  1/2017 Gong .................. H01L 22/14
2018/0012774 A1*  1/2018 Hu ..................... H01L 21/4853
2019/0043792 A1*  2/2019 Weerasekera ....... H01L 21/4857

* cited by examiner

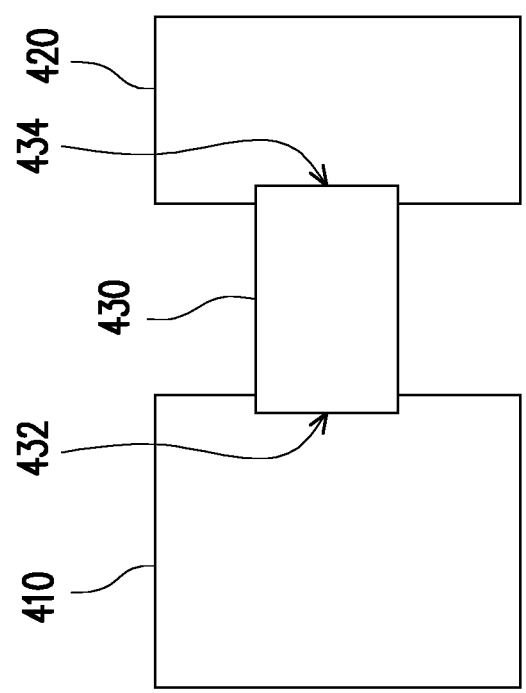

SUBSTRATE STRUCTURE AND ELECTRONIC DEVICE HAVING COARSE REDISTRIBUTION LAYER ELECTRICALLY CONNECTED TO FINE REDISTRIBUTION LAYER

CROSS-REFERENCE TO RELATED APPLICATION

This application claims the priority benefits of U.S. provisional application Ser. No. 62/596,068, filed on Dec. 7, 2017 and Taiwan application serial no. 107133917, filed on Sep. 26, 2018. The entirety of each of the above-mentioned patent applications is hereby incorporated by reference herein and made a part of this specification.

BACKGROUND OF THE INVENTION

1. Field of the Invention

The present invention relates to an integrated circuit component, and more particularly to a substrate structure and an electronic device.

2. Description of Related Art

With the booming of the electronics industry, in order to achieve high density and high efficiency, all kinds of electronic products are moving towards light, thin, short and small. For example, in order to make electronic products thinner, it is generally desirable to provide a thinner package structure with high-density. Therefore, in the case where the size of the semiconductor chip and the size of the package structure are continuously reduced, how to develop a circuit board structure with fine circuitry and coarse circuitry density that can be matched with the package structure/the semiconductor chip without increasing excessive manufacturing costs has become a challenge to researchers in the field.

In addition, in an application of the circuit board, for example, an electronic device including a sensor element or a camera lens has numerous components of the package module so that the overall thickness of the electronic device is difficult to be reduced and the overall size of the electronic device is also difficult to be reduced. Moreover, in another application of the circuit board, general optical communication requires the use of multiple optical fibers. However, the conventional manufacturing method requires that each optical fiber is separately packaged, resulting in a complicated process and high manufacturing cost. Therefore, how to effectively simplify the manufacturing process of electronic devices and improve overall production efficiency has become one of the important research and development topics in the semiconductor industry and related electronics industries.

SUMMARY OF THE INVENTION

The disclosure provides a substrate structure including a first portion, a second portion, and an intermediate portion disposed between and electrically connected between the first portion and the second portion. The first portion includes a first fine redistribution layer and a first coarse redistribution layer. The first fine redistribution layer includes a first fine conductive pattern, and the first coarse redistribution layer is disposed on the first fine redistribution layer and electrically connected to the first fine redistribution layer. The first coarse redistribution layer includes a first coarse conductive pattern electrically connected to the first fine conductive pattern, where a layout density of the first fine conductive pattern is denser than that of the first coarse conductive pattern. The second portion includes at least one of a second fine redistribution layer and a second coarse redistribution layer.

The disclosure provides an electronic device including a substrate structure, a chip and an image sensing unit. The substrate structure includes a fine redistribution layer and a coarse redistribution layer. The fine redistribution layer has a first opening and includes a fine conductive pattern, and the coarse redistribution layer has a second opening in communication with the first opening, and the coarse redistribution layer is disposed on the fine redistribution layer and electrically connected to fine redistribution layer. The coarse redistribution layer includes a coarse conductive pattern electrically connected to the fine conductive pattern, where a layout density of the fine conductive pattern is denser than that of the coarse conductive pattern, and the second opening of the coarse redistribution layer exposes at least a portion of the fine redistribution layer. The chip including a sensing region is disposed in the second opening of the coarse redistribution layer and electrically connected to at least the portion of the fine redistribution layer exposed by the second opening, where the first opening of the fine redistribution layer exposes the sensing region of the chip. The image sensing unit is disposed on the substrate structure and corresponds to the sensing region of the chip.

The disclosure provides an electronic device including a substrate structure, a signal transmission component embedded in the substrate structure, a chip, and a conversion unit. The substrate structure includes a coarse redistribution layer and a fine redistribution layer. The coarse redistribution layer includes a coarse conductive pattern and the fine redistribution layer is embedded in the coarse redistribution layer. The fine redistribution layer includes a fine conductive pattern electrically connected to the coarse conductive pattern, where a layout density of the fine conductive pattern is denser than that of the coarse conductive pattern. The chip is disposed on the substrate structure and connected to the fine redistribution layer. The conversion unit is disposed on the substrate structure and located aside the chip. The conversion unit is coupled to the signal transmission component, where the chip is electrically connected to the conversion unit via the fine redistribution layer of the substrate structure. A first signal of the chip is transmitted to the signal transmission component via the conversion unit and/or a second signal of the signal transmission component is transmitted to the chip via the conversion unit.

Based on the above, the first portion of the substrate structure of the disclosure includes the fine redistribution layer and the coarse redistribution layer, so that the chip may be directly mounted on the fine redistribution layer, thereby reducing the thickness of the structure. Moreover, an electronic device of the disclosure includes the substrate structure similar to the aforementioned substrate structure, and the chip is disposed inside the substrate structure to be directly connected to the fine redistribution layer of the substrate structure, thereby reducing the thickness of the electronic device and meeting the requirement of lightness, thinness and shortness of the electronic device. Another electronic device of the disclosure includes the substrate structure similar to the aforementioned substrate structure, and the substrate structure can simultaneously transmit optical signals and electrical signals, thereby allowing the chip to process a greater amount of information.

To make the above features and advantages of the more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5 is a schematic top view of a substrate structure in accordance with some embodiments of the present invention.

DESCRIPTION OF THE EMBODIMENTS

Figure 1A:
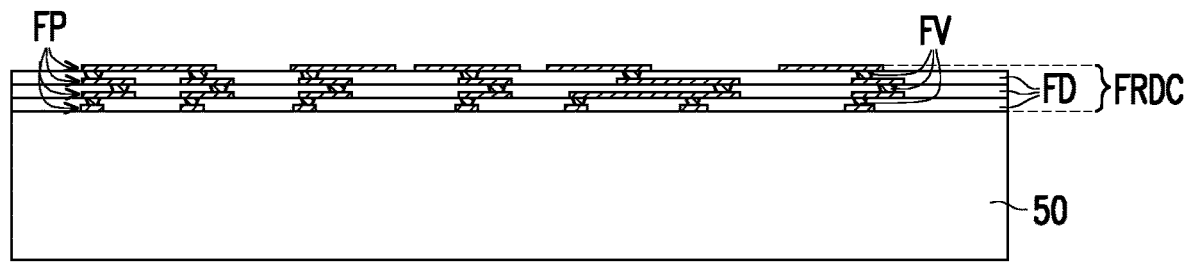
FIGS. 1A-1E are schematic cross-sectional views showing a manufacturing method of a package substrate in accordance with some embodiments of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1E are schematic cross-sectional views showing a manufacturing method of a package substrate in accordance with some embodiments of the present invention. FIG. 2 is a schematic cross-sectional view of a fine conductive via and a first conductive via in accordance with some embodiments of the present invention. Referring to FIG. 1A first, a fine redistribution circuitry FRDC is formed on a temporary substrate 50. The fine redistribution circuitry FRDC includes a fine conductive pattern FP, a fine dielectric layer FD and a fine conductive via FV. In some embodiments, the fine conductive pattern FP is stacked on the fine dielectric layer FD. The temporary carrier 50 may be made of glass, plastic, or other suitable materials as long as the material is able to withstand the subsequent processes while carrying a structure formed thereon. In some embodiments, a release layer (not shown) may be formed on the temporary carrier 50 to enhance the releasibility of the fine redistribution circuitry FRDC from the temporary carrier 50 in a subsequent process.

For example, the fine conductive pattern FP may be formed on the temporary carrier 50 using a deposition process, a lithography process and an etching process, or other suitable processes. The fine conductive pattern FP may be a patterned conductive layer with fine line/space routing. Next, the fine dielectric layer FD including a plurality of openings may be formed over the temporary carrier 50 to cover the fine conductive pattern FP using, for example, a coating process, a lithography process and an etching process, or other suitable processes. The openings of the fine dielectric layer FD may expose at least a portion of the fine conductive pattern FP for electrical connection. Subsequently, a plurality of fine conductive vias FV may be formed in the openings of the fine dielectric layer FD and may be connected to the fine conductive patterns FP. In some embodiments, the fine conductive vias FV and the fine conductive patterns FP may be formed in the same process. The abovementioned steps may be performed multiple times such that the fine conductive patterns FP and the fine dielectric layers FD are alternatively stacked. In such embodiments, the fine conductive vias FV may be formed to connect between the fine conductive patterns FP in different layers to obtain a multi-layered redistribution circuitry as required by the circuit design. As shown in FIG. 1A, the topmost fine conductive pattern FP may be disposed on the fine dielectric layer FD for further electrical connection. In other words, the fine redistribution circuitry FRDC can be a multi-layered stacking structure having fine line/space routing. In some embodiments, the fine dielectric layer FD may be formed on the temporary carrier 50 before forming the fine conductive pattern FP. However, it construes no limitation in the disclosure as to the forming sequences of the fine conductive pattern FP and the fine dielectric layer FD.

Figure 1B:
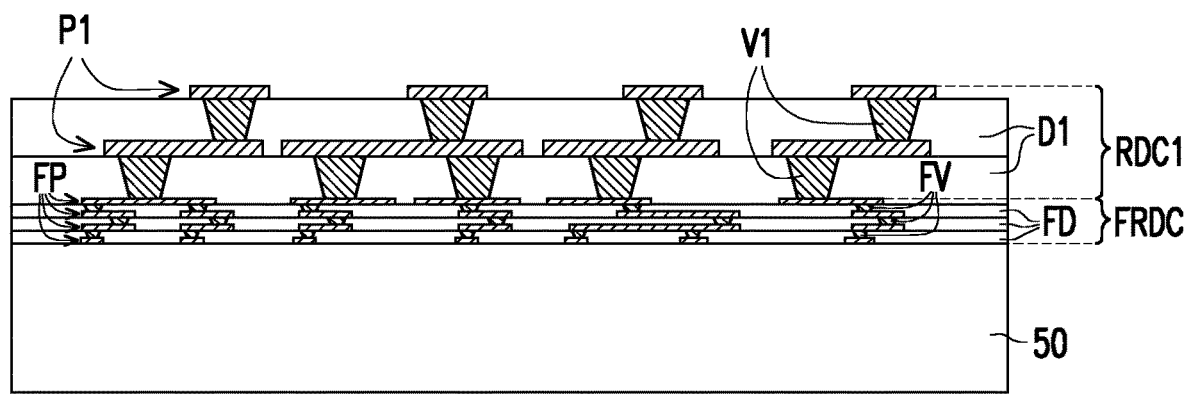
Figure 2:
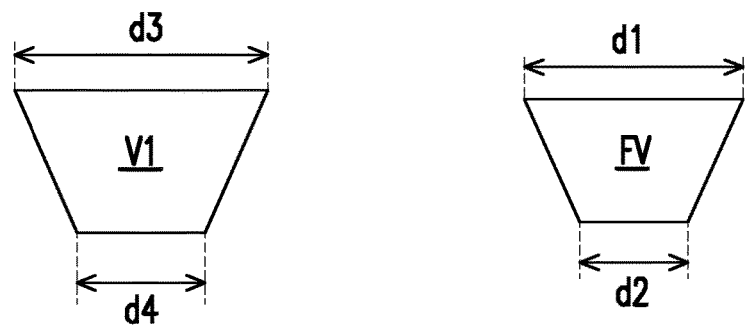
FIG. 2 is a schematic cross-sectional view of a fine conductive via and a first conductive via in accordance with some embodiments of the present invention.

Referring to FIG. 1B, a first redistribution circuitry RDC1 is disposed on the fine redistribution circuitry FRDC. A thickness of the fine redistribution circuitry FRDC is, for example, less than a thickness of the first redistribution circuitry RDC1. The first redistribution circuitry RDC1 includes a first conductive pattern P1, a first dielectric layer D1, and a first conductive via V1 disposed in the first dielectric layer D1. The first conductive via V1 is disposed on the topmost layer of the fine conductive pattern FP and electrically connected to the first conductive pattern P1. The first conductive pattern P1 may be electrically connected to the fine conductive pattern FP through the first conductive via V1 and stacked on the first dielectric layer D1. For example, the first dielectric layer D1 includes a plurality of openings and may be formed over the topmost layer of the fine conductive pattern FP using a deposition process, a lithography process and an etching process, or other suitable processes. The openings of the first dielectric layer D1 may expose at least a portion of the topmost layer of the fine conductive patterns FP for electrical connection. Next, a plurality of first conductive vias V1 may be formed in the openings of the first dielectric layer D1 to be in direct contact with the fine conductive patterns FP. The first conductive pattern P1 may be formed on the first conductive vias V1 to electrically connect the fine redistribution circuitry FRDC. In some embodiments, the first conductive vias V1 and the first conductive pattern P1 are formed in the same process. The first conductive pattern P1 may be a patterned conductive layer with coarse line/space routing. That is, the line/space of the fine conductive pattern FP is less than that of the first conductive pattern P1. A layout density of the fine conductive pattern FP is denser than that of the first conductive pattern P1. In some embodiments, the first dielectric layer D1 may be subsequently formed over the first conductive pattern P1 and the openings of the first dielectric layer D1 may expose at least a portion of the first conductive pattern P1 so as to form the first conductive vias V1. The abovementioned steps may be performed multiple times such that the first conductive patterns P1 and the first dielectric layers D1 are alternatively stacked. In such embodiments, as shown in FIG. 1B, the first conductive vias V1 may be formed to connect between the fine conductive pattern FP and the first conductive pattern P1 and also between the first conductive patterns P1 in different layers so as to obtain a multi-layered redistribution circuitry.

In some embodiments, the first redistribution circuitry RDC1 may be viewed as a coarse redistribution circuitry relative to the fine redistribution circuitry FRDC. A dimension of the fine conductive pattern FP is, for instance, less than a dimension of the first conductive pattern P1. For example, the line/space of the fine conductive pattern FP is finer than the line/space of the first conductive pattern P1. In some embodiments, a thickness of the fine dielectric layer FD is less than a thickness of the first dielectric layer D1. In some embodiments, each of the fine conductive vias FV is tapered in a direction toward the temporary carrier 50. For example, as shown in FIG. 1B and FIG. 2, an outer diameter d1 of one end of the fine conductive via FV facing towards the first redistribution circuitry RDC1 is greater than an outer diameter d2 of another end of the fine conductive via FV facing away from the first redistribution circuitry RDC1. In some embodiments, each of the first conductive vias V1 is tapered in a direction toward the fine redistribution circuitry FRDC. For example, as shown in FIG. 1B and FIG. 2, an outer diameter d3 of one end of the first conductive via V1 facing away from the fine redistribution circuitry FRDC is greater than an outer diameter d4 of another end of the first conductive via V1 facing toward the fine redistribution circuitry FRDC. In some embodiments, each of the first conductive vias V1 has a trapezoid shape with wide top and narrow bottom in a cross-sectional view. The size of each of the first conductive vias V1 is greater than the size of each of the fine conductive vias FV.

Figure 1C:
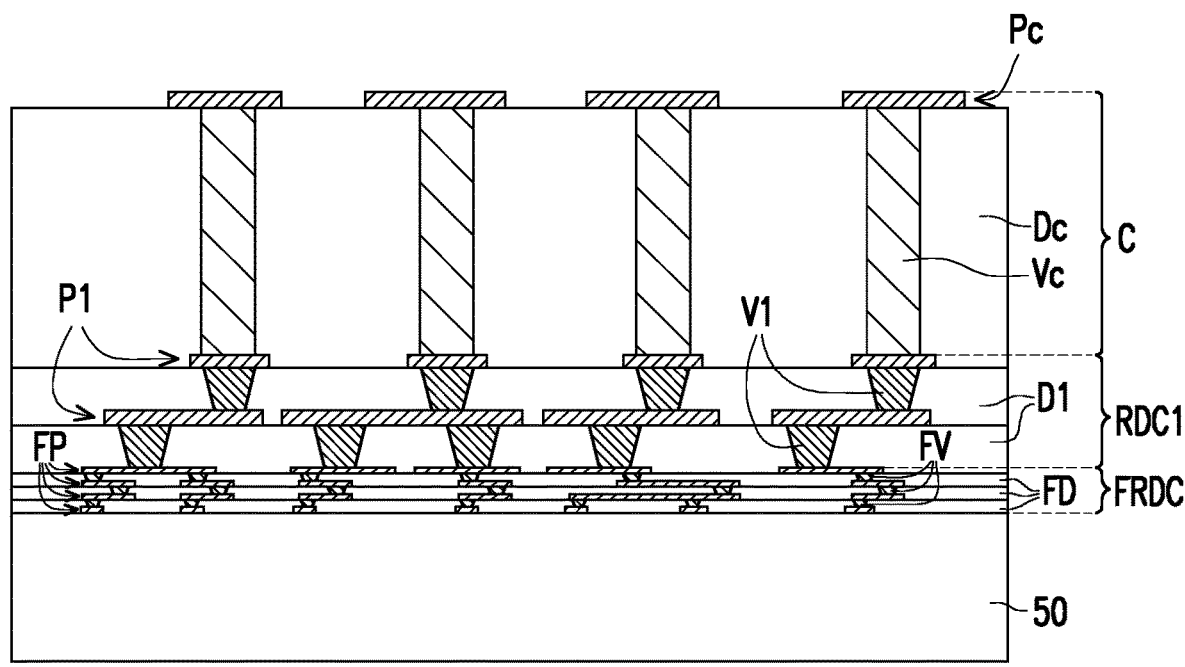

Referring to FIG. 1C, a core C is disposed on the first redistribution circuitry RDC1 opposite to the fine redistribution circuitry FRDC and electrically connected to the first conductive pattern P1. The Young's modulus of the core C is greater than the Young's modulus of the first redistribution circuitry RDC1. In some embodiments, the core C may include materials such as pre-preg, ceramic, metal, or other suitable materials. For example, the core C includes a core dielectric layer Dc, a core conductive pattern Pc and a through conductive via Vc. For example, a plurality of through conductive vias Vc is embedded in the core dielectric layer Dc and electrically connected to the first redistribution circuitry RDC1. The core conductive pattern Pc may be disposed on the core dielectric layer Dc opposite to the first redistribution circuitry RDC1 and electrically connected to the through conductive vias Vc. In some embodiments, the core dielectric layer Dc includes a plurality of openings and may be formed over the first redistribution circuitry RDC1. The openings of the core dielectric layer Dc may expose the topmost layer of the first conductive pattern P1. Next, the through conductive vias Vc may be formed in the openings of the core dielectric layer Dc to connect the topmost layer of the first conductive pattern P1. Subsequently, the core conductive pattern Pc may be formed on the core dielectric layer Dc to connect the through conductive vias Vc. In some embodiments, the through conductive vias Vc may be formed before forming the core dielectric layer Dc. However, it construes no limitation in the disclosure as to the forming sequences of the core dielectric layer Dc and the through conductive vias Vc.

One property of a material to consider is the stiffness of the material, which can be expressed as Young's modulus. The Young's modulus of the core dielectric layer Dc may be greater than the Young's modulus of the first dielectric layer D1 of the first redistribution circuitry RDC1 and may be also greater than the Young's modulus of the fine dielectric layer FD of the fine redistribution circuitry FRDC. In other words, the material of the core dielectric layer Dc is stiffer than the material of the first dielectric layer D1 and also stiffer than the material of the fine dielectric layer FD. In some embodiments, a thickness of the first dielectric layer D1 is thinner than a thickness of the core dielectric layer Dc. A thickness of the core C may be determined by the Young's modulus or stiffness of the core dielectric layer Dc, and the thickness of the core C is not limited in the disclosure. For example, the core C with a higher stiffness may be thinner while still maintaining the stability of the structure. In other words, the core C with a higher Young's modulus than the dielectric layers (e.g., the first dielectric layer D1, fine dielectric layer FD) in the interconnection structure is used to reinforce the mechanical stability of the package. Another material property to consider is the coefficient of thermal expansion (CTE). In some embodiments, the materials for the core dielectric layer Dc may have a CTE in proximity to or substantially equal to that of a silicon-based die (e.g., about 2.7 ppm) which is to be mounted on the core C. In some embodiments, a CTE of the first dielectric layer D1 of the first redistribution circuitry RDC1 is greater than the CTE of the core dielectric layer Dc.

Figure 1D:
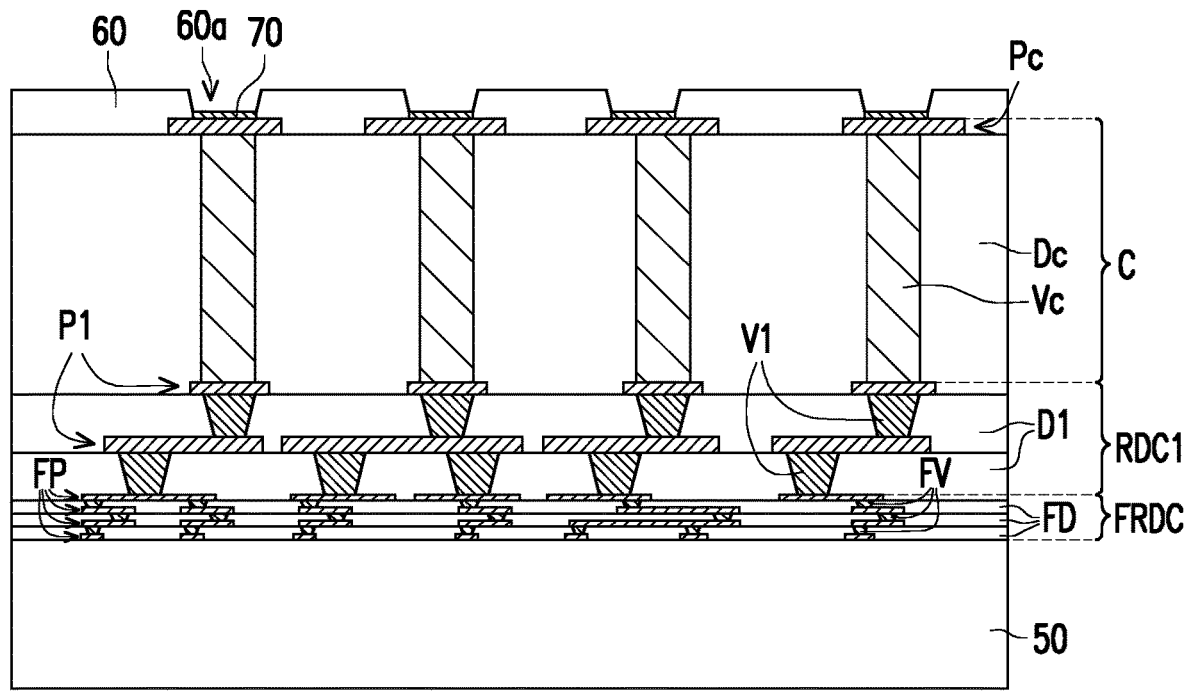

Referring to FIG. 1D, a passivation layer 60 is disposed on the core C opposite to the first redistribution circuitry RDC1. The passivation layer 60 may have at least one opening 60a exposing a portion of the core conductive pattern Pc. The portion of the core conductive pattern Pc exposed by the opening 60a may serve as the electrical contact pads. In some embodiments, the core conductive pattern Pc may be used for ball mounting. For example, the passivation layer 60 may be a solder mask, or may include inorganic materials or other suitable insulating materials. In some embodiments, a plurality of surface finishing layers 70 may be disposed in the openings 60a of the passivation layer 60 and on portions of the core conductive pattern Pc exposed by the openings 60a for preventing the core conductive pattern Pc from oxidation. In some embodiments, the surface finishing layers 70 are disposed on the core conductive pattern Pc for protection and for improving solderability.

Figure 1E:
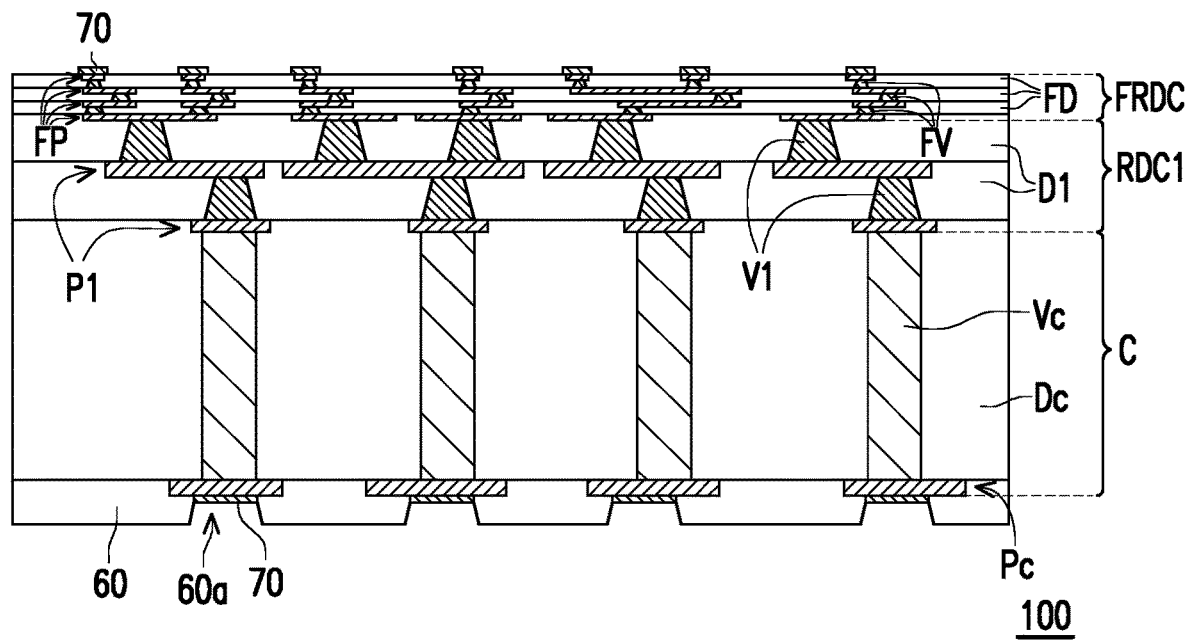

Referring to FIG. 1E, the temporary carrier 50 may be removed from the fine redistribution circuitry FRDC by, for example, applying external energy between the fine redistribution circuitry FRDC and the temporary carrier 50 to peel off the release layer or by using other suitable processes to remove the temporary carrier 50. In some embodiments, after removing the temporary carrier 50, the fine conductive pattern FP is exposed and then the surface finishing layers 70 may be formed on the exposed fine conductive pattern FP for protection. The manufacturing process of a package substrate 100 is then substantially complete. The package substrate 100 includes the core conductive pattern Pc and the fine conductive pattern FP respectively exposed from the passivation layer 60 and the fine dielectric layer FD for further electrical connection.

Figure 3A:
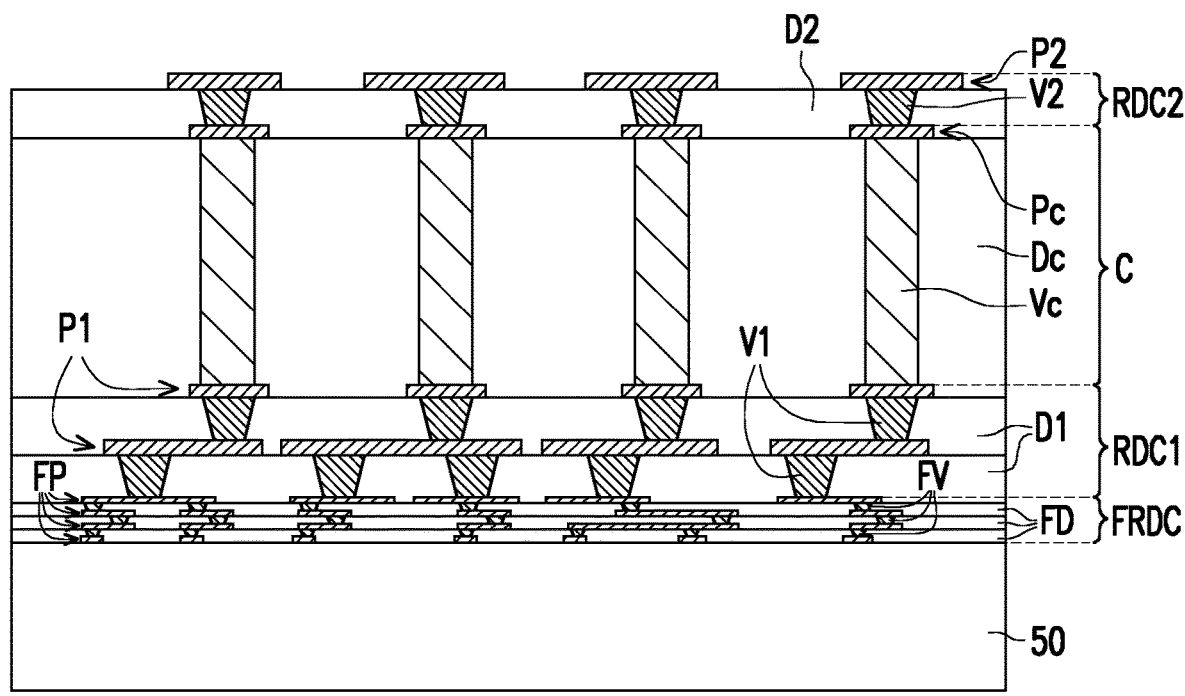
FIGS. 3A-3C are schematic cross-sectional views showing a manufacturing method of a package substrate in accordance with some embodiments of the present invention.
Figure 3B:
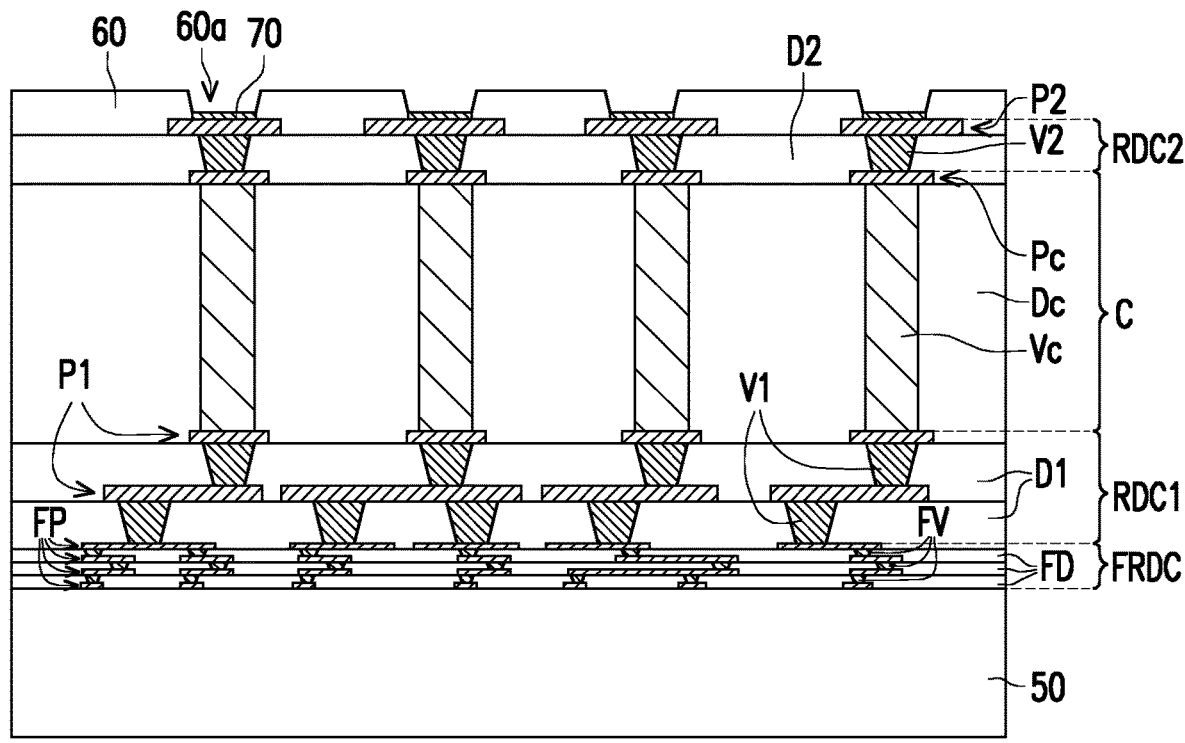
Figure 3C:
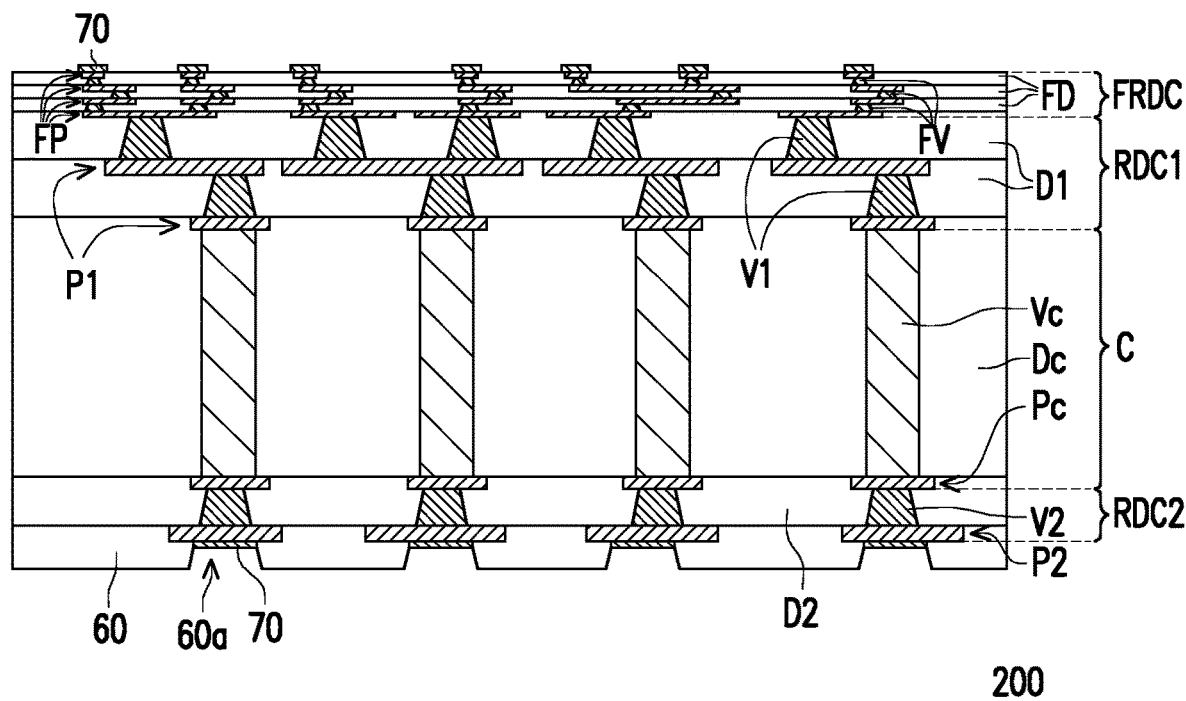

FIGS. 3A-3C are schematic cross-sectional views showing a manufacturing method of a package substrate in accordance with some embodiments of the present invention. The manufacturing method of the present embodiment is similar to that of the embodiment illustrated in FIGS. 1A to 1E. Identical or similar numbers refer to identical or similar elements throughout the drawings, and already described detail thereof is not repeated herein. The difference between the present embodiment and the abovementioned embodiment lies in that after forming the core C, a second redistribution circuitry RDC2 is formed on the core C opposite to the first redistribution circuitry RDC1.

Referring to FIG. 3A, the second redistribution circuitry RDC2 includes a second conductive pattern P2, a second dielectric layer D2 disposed on the core C, and a second conductive via V2 disposed on the core conductive pattern Pc. The second conductive pattern P2 may be stacked on the second dielectric layer D2 and the second conductive pattern P2 is electrically connected to the core C through the second conductive via V2. The forming process of the second redistribution circuitry RDC2 may be similar to the forming process of the first redistribution circuitry RDC1, so the detailed descriptions are omitted herein for brevity. The second dielectric layer D2 and the second conductive pattern P2 may be alternatively stacked to obtain a multi-layered redistribution circuitry as required by the circuit design. In some embodiments, the amount of the stacked layers of the first dielectric layer D1 may be greater than the amount of the stacked layers of the second dielectric layer D2. In some other embodiments, the amount of the stacked layers of the first dielectric layer D1 may be less than or equal to the amount of the stacked layers of the second dielectric layer D2 depending on the design requirements. In some embodiments, the number of the stacked layers of the first conductive patterns P1 in the first redistribution circuitry RDC1 is greater than the number of the stacked layers of the second conductive patterns P2 in the second redistribution circuitry RDC2. In some embodiments, each of the second conductive vias V2 is tapered in a direction toward the core C. In other words, the second conductive vias V2 and the first conductive vias V1 are tapered in the same direction toward the fine redistribution circuitry FRDC. For example, an outer diameter of one end of the second conductive via V2 facing away from the core C is greater than an outer diameter of another end of the second conductive via V2 facing toward the core C. In some embodiments, each of the second conductive vias V2 has a trapezoid shape with wide top and narrow bottom in a cross-sectional view. The size of the second conductive via V2 may be similar to the size of the first conductive via V1 as shown in FIG. 3A. The size of each of the second conductive vias V2 is greater than the size of each of the fine conductive vias FV. The line/space of the fine conductive pattern FP is finer than the line/space of the second conductive pattern P2. The Young's modulus of the core dielectric layer Dc may be greater than the Young's modulus of the second dielectric layer D2 of the second redistribution circuitry RDC2. A thickness of the second dielectric layer D2 may be thinner than a thickness of the core dielectric layer Dc. In some embodiments, a CTE of the second dielectric layer D2, as well as the CTE of the first dielectric layer D1, is greater than the CTE of the core dielectric layer Dc.

Referring to FIG. 3B, the passivation layer 60 is disposed on the second redistribution circuitry RDC2 opposite to the core C. The passivation layer 60 may have at least one opening 60a exposing a portion of the second conductive pattern P2. In some embodiments, the surface finishing layers 70 may be respectively disposed in the openings 60a of the passivation layer 60 and respectively disposed on portions of the second conductive pattern P2 exposed by the openings 60a.

Referring to FIG. 3C, the temporary carrier 50 may be removed from the fine redistribution circuitry FRDC to expose the fine conductive pattern FP. In some embodiments, after removing the temporary carrier 50, the fine conductive pattern FP is exposed, and then the surface finishing layers 70 may be formed on the exposed fine conductive pattern FP for protection. The manufacturing process of a package substrate 200 is then substantially complete. The package substrate 200 includes the second conductive pattern P2 and the fine conductive pattern FP for further electrical connection. In some embodiments, a thickness of the fine redistribution circuitry FRDC is thinner than a thickness of the second redistribution circuitry RDC2, and a dimension of the fine conductive pattern FP is smaller than a dimension of the second conductive pattern P2.

Figure 4:
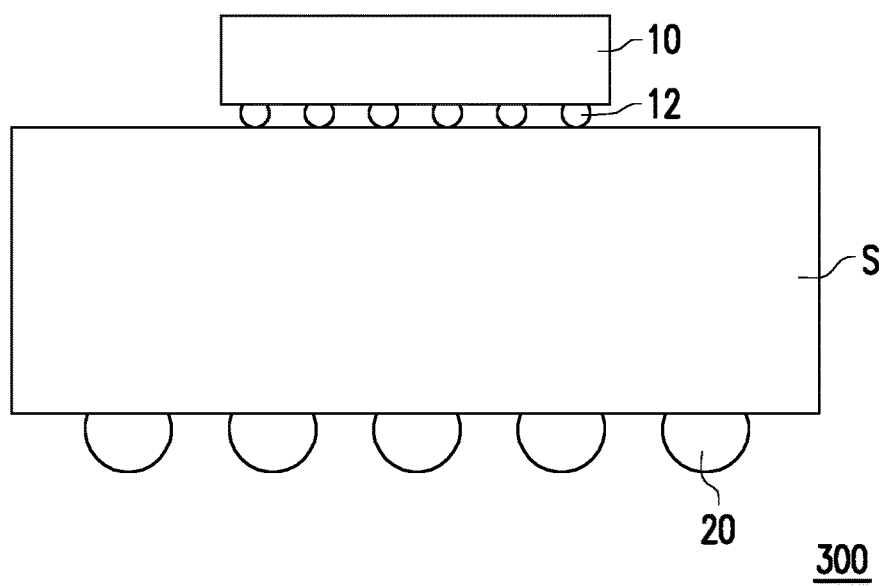
FIG. 4 is a schematic cross-sectional view of a package structure in accordance with some embodiments of the present invention.

FIG. 4 is a schematic cross-sectional view of a package structure in accordance with some embodiments of the present invention. Referring to FIG. 4, a package structure 300 includes a package substrate S and a semiconductor chip 10. The package structure 300 may further include at least one conductive terminal 20. In some embodiments, the portions of the outermost layer of the fine conductive pattern FP connected to the semiconductor chip 10 are bump pads. For example, a plurality of conductive bumps 12 disposed on the active surface of the semiconductor chip 10 can be used to electrically connect the package substrate S to the semiconductor chip 10. As semiconductor structures become more advanced, the need for higher input/output density leads to a tighter bump pitch. The fine redistribution circuitry FRDC of the package substrate S (e.g. package substrate 100 in FIG. 1E or package substrate 200 in FIG. 3C) meets the fine line/space requirements of such high bump density of flip chips.

Furthermore, the package substrate S may be provided as the package substrate 100 shown in FIG. 1E. The semiconductor chip 10 is disposed on the fine redistribution circuitry FRDC opposite to the first redistribution circuitry RDC1 using the flip-chip technique to electrically connect the fine redistribution circuitry FRDC to the semiconductor chip 10. In some embodiments, the fine redistribution circuitry FRDC and the first redistribution circuitry RDC1 can be used for redistribution as well as for power/ground circuit routing distribution. The conductive terminals 20 may be disposed on the core C opposite to the semiconductor chip 10 and electrically connected to the semiconductor chip 10 through the core C. As such, the package structure 300 has a short electrical conduction path from the semiconductor chip 10 to the conductive terminals 20 for better circuit performance. In some other embodiments, the package substrate S may be provided as the package substrate 200 shown in FIG. 3C. The semiconductor chip 10 may be disposed on the fine redistribution circuitry FRDC opposite to the second redistribution circuitry RDC2 so as to be electrically connected to the fine redistribution circuitry FRDC. The conductive terminals 20 may be disposed on the second redistribution circuitry RDC2 opposite to the semiconductor chip 10 and electrically connected to the semiconductor chip 10 through the second redistribution circuitry RDC2.

FIG. 5 is a schematic top view of a substrate structure in accordance with some embodiments of the present invention. Referring to FIG. 5, a substrate structure 400 includes a first portion 410, a second portion 420, and an intermediate portion 430. The intermediate portion 430 may be disposed between the first portion 410 and the second portion 420 and electrically connected to the first portion 410 and the second portion 420. For example, the substrate structure 400 can serve as a base of a mother board or a base of a module board for carrying electronic components (not shown), where the electronic components can be mounted on the first portion 410 and/or the second portion 410 of the substrate structure 400. The first portion 410 of the substrate structure 400 includes a first fine redistribution layer and a first coarse redistribution layer disposed on and electrically connected to the first fine redistribution layer.

In some embodiments, the first fine redistribution layer of the first portion 410 is similar to the fine redistribution circuitry FRDC of the aforementioned embodiments. For example, the first fine redistribution layer includes a first fine conductive pattern (e.g., the fine conductive pattern FP in FIG. 1A), a first fine dielectric layer (e.g., the fine dielectric layer FD in FIG. 1A), and the first fine conductive vias (e.g., the fine conductive vias FV in FIG. 1A). The first coarse redistribution layer of the first portion 420 is similar to the first redistribution circuitry RDC1 of the aforementioned embodiments. For example, the first coarse redistribution layer includes a first coarse conductive pattern (e.g., the first conductive pattern P1 in FIG. 1B) electrically connected to the first fine conductive pattern, a first coarse conductive via (e.g., the first conductive via V1 in FIG. 1B) connected between the first coarse conductive pattern and the first fine conductive pattern. That is, the first fine conductive via and the first coarse conductive via are respectively disposed on two opposite sides of the first fine conductive pattern of the first fine redistribution layer. The outer diameter of the first fine conductive via of the first fine redistribution layer and the outer diameter of the first coarse conductive via of the first coarse redistribution layer are tapered toward the same direction as shown in FIG. 1B. In some embodiments, the first fine conductive pattern has a layout density denser than that of the first coarse conductive pattern so that electronic components (e.g., active/passive components having high density contacts) may be mounted onto the first fine redistribution layer of the first portion 410. In other embodiments, the first portion 410 of the substrate structure 400 may be similar to the package substrate 100 as shown in FIG. 1E or the package substrate 200 as shown in FIG. 3C. That is, the first portion 410 of the substrate structure 400 may further include the core C to enhance the mechanical reliability of the overall structure and the second redistribution circuitry RDC2 may be selectively disposed on the core C for further electrical connection.

The second portion 420 of the substrate structure 400 may include at least one of a second fine redistribution layer and/or a second coarse redistribution layer (e.g., only second fine redistribution layer, only second coarse redistribution layer, combination of second fine redistribution layer and second coarse redistribution layer). Moreover, according to design requirements, the second portion 420 may be a fine redistribution layer (similar to the fine redistribution circuitry FRDC of the aforementioned embodiments) or may be a coarse redistribution layer (similar to the first redistribution circuitry RDC1 of the aforementioned embodiments), and details are not described herein for brevity. In some embodiments, the second portion 420 may be similar to the first portion 410 and include a second fine redistribution layer and a second coarse redistribution layer disposed on the second fine redistribution layer. In some embodiments, the second portion 420 may include a second fine redistribution layer, a second coarse redistribution layer disposed on the second fine redistribution layer, and a core disposed on the second coarse redistribution layer (similar to the structure of FIG. 1E or FIG. 3C of the foregoing embodiments) to enhance the mechanical reliability of the overall structure.

The second portion 420 of the substrate structure 400 may be a discrete element that is spatially separated from the first portion 410, while the intermediate portion 430 includes circuitry to be electrically connected to the first portion 410 and the second portion 420. For example, the first end 432 of the intermediate portion 430 is connected to the first portion 410 and the second end 434 of the intermediate portion 430 opposite to the first end 432 is connected to the second portion 420. The sizes of the areas where the first end 432 and the second end 434 of the intermediate portion 430 overlap with the first portion 410 and the second portion 420 may be adjusted according to circuitry design requirements. The sizes of the areas in which the intermediate portion 430 overlaps the first portion 410 and the second portion 420 construe no limitation in the disclosure. For example, the first portion 410 and the second portion 420 may be disposed on the same side of the intermediate portion 430. In other embodiments, the first portion 410 and the second portion 420 may be disposed on two opposite sides of the intermediate portion 430. That is, the intermediate portion 430 is staggered between the first portion 410 and the second portion 420. In some embodiments, the intermediate portion 430 is a flexible circuit board. The intermediate portion 430 may further include a signal transmission component. For example, the signal transmission component may be an optical fiber for transmitting optical signals or electrical signals from electronic components mounted on the substrate structure 400. Since the first portion 410 of the substrate structure 400 includes a fine redistribution layer and a coarse redistribution layer, the chip including the high density contacts may be directly mounted on the fine redistribution layer without configuration of additional interposer. The substrate structure 400 including the intermediate portion 430 flexibly connected between the first portion 410 and the second portion 420 so that the substrate structure 400 may be adapted to different configuration requirements of various products, thereby reducing manufacturing costs.

Figure 6A:
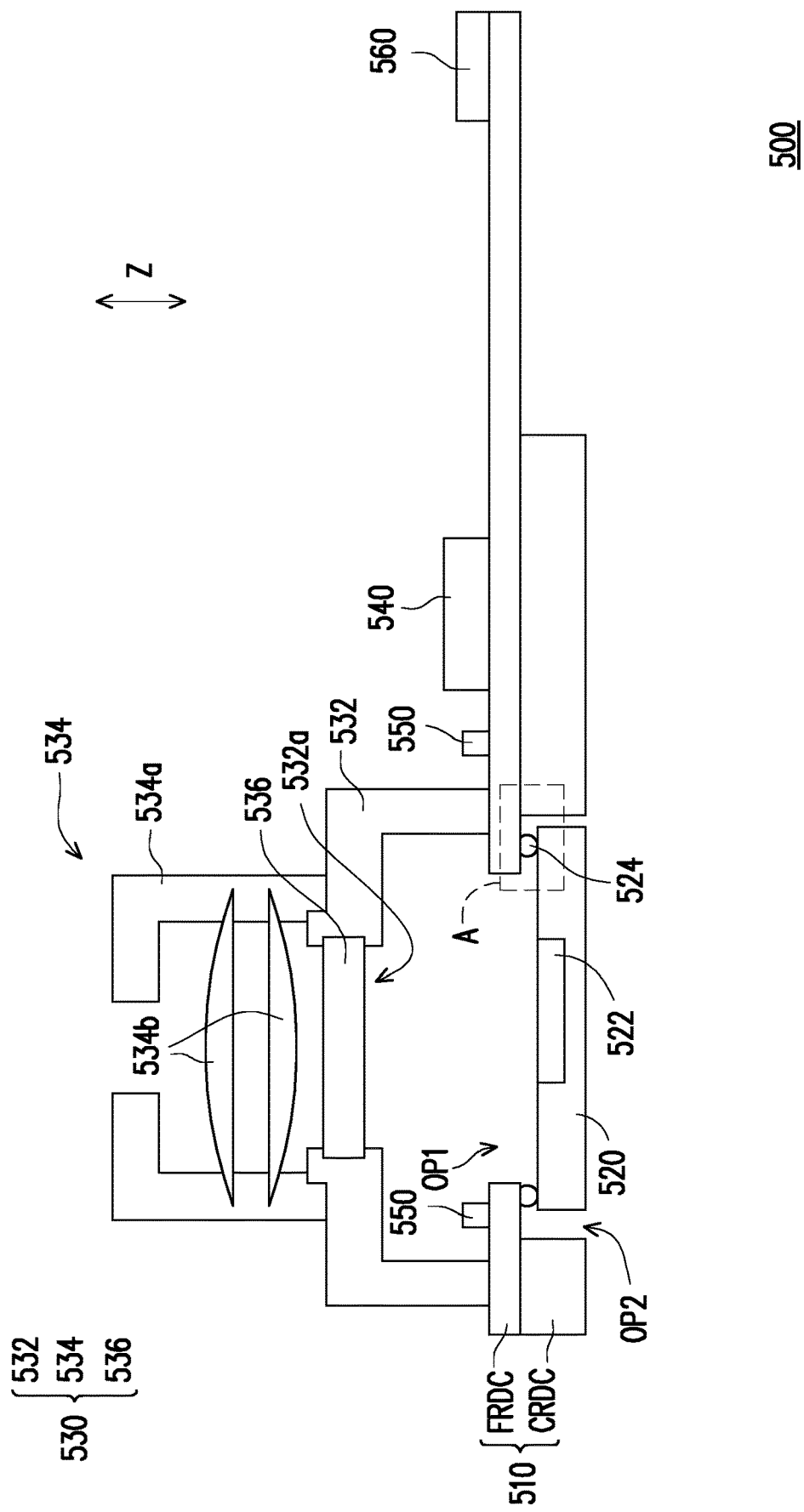
FIG. 6A is a schematic cross-sectional view of an electronic device in accordance with some embodiments of the present invention.
Figure 6B:
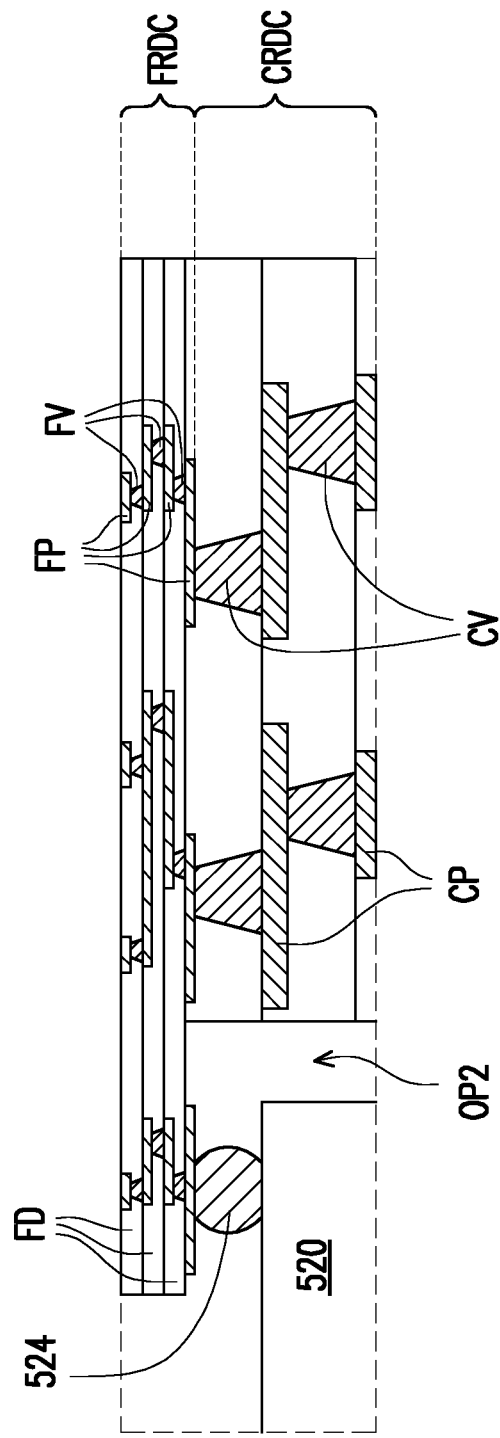
FIG. 6B is an enlarged schematic view of a region A in FIG. 6A.

FIG. 6A is a schematic cross-sectional view of an electronic device in accordance with some embodiments of the present invention, and FIG. 6B is an enlarged schematic view of a region A in FIG. 6A. Referring to FIG. 6A and FIG. 6B, an electronic device 500 includes a substrate structure 510, a chip 520, and an image sensing unit 530. The substrate structure 510 includes a fine redistribution circuitry FRDC and a coarse redistribution circuitry CRDC disposed on and electrically connected to the fine redistribution circuitry FRDC. In some embodiments, the coarse redistribution circuitry CRDC is stacked along a thickness direction Z of the fine redistribution circuitry FRDC. For example, the thickness of the fine redistribution circuitry FRDC may be thinner than the thickness of the coarse redistribution circuitry CRDC. The fine redistribution circuitry FRDC may extend outwardly from an edge of the coarse redistribution circuitry CRDC. For example, the length of the fine redistribution circuitry FRDC may be longer than the length of the coarse redistribution circuitry CRDC. The Young's modulus of the fine redistribution circuitry FRDC is smaller than the Young's modulus of the coarse redistribution circuitry CRDC. For example, the fine redistribution circuitry FRDC is flexible. Therefore, a portion of the fine redistribution circuitry FRDC (e.g., a portion which is not overlapped with the coarse redistribution circuitry CRDC) may be bent based on product requirements.

The fine redistribution circuitry FRDC includes the fine conductive pattern FP and the coarse redistribution circuitry CRDC includes the coarse conductive pattern CP, where the layout density of the fine conductive pattern FP is denser than that of the coarse conductive pattern CP. The fine redistribution circuitry FRDC further includes the fine conductive via FV and the coarse redistribution layer CRDC further includes the coarse conductive via CV. The fine conductive vias FV and the coarse conductive vias CV may be respectively disposed on two opposite sides of the fine conductive pattern FP. The outer diameter of the fine conductive via FV and the outer diameter of the coarse conductive via CV are tapered toward the same direction as shown in FIG. 6B. For example, the fine redistribution circuitry FRDC is similar to the fine redistribution circuitry FRDC of the foregoing embodiments (as shown in FIG. 1B) and the coarse redistribution circuitry CRDC is similar to the first redistribution circuitry RDC1 of the foregoing embodiments (as shown in FIG. 1B), so details are not described herein for brevity.

In some embodiments, the fine redistribution circuitry FRDC has a first opening OP1, and the coarse redistribution circuitry CRDC has a second opening OP2 in communication with the first opening OP1. For example, the second opening OP2 of the coarse redistribution circuitry CRDC at least exposes the sensing region 522 of the chip 520 so that light may reach the sensing region 522 through the first opening OP1 and the second opening OP2. In some embodiments, the size of the second opening OP2 of the coarse redistribution circuitry CRDC is large enough to accommodate the chip 520 therein, and the second opening OP2 exposes a portion of the fine redistribution circuitry FRDC so that the chip 520 accommodated inside the second opening OP2 may be electrically connected to a portion of the fine redistribution circuitry FRDC exposed by the second opening OP2. In some embodiments, the chip 520 is directly and electrically connected to the portion of the fine redistribution circuitry FRDC exposed by the second opening OP2, and the chip 520 is electrically connected to the coarse redistribution circuitry CRDC through the fine redistribution circuitry FRDC. That is, the chip 520 is not in direct electrical contact with the coarse redistribution circuitry CRDC. In other embodiments, the chip 520 may be disposed on the other side of the coarse redistribution circuitry CRDC opposite to the fine redistribution circuitry FRDC.

For example, the chip 520 may be an image sensing chip that includes a sensing region 522 and a plurality of conductive bumps 524 surrounding the sensing region 522. The conductive bumps 524 may be connected to the fine conductive pattern FP exposed by the second opening OP2 by flip chip bonding so as to mount the chip 520 on the fine redistribution circuitry FRDC, so that the signals of the chip 520 may be transmitted to other electronic components mounted on the substrate structure 510 via the conductive bumps 524. In some embodiments, an underfill (not shown) may be disposed on the fine redistribution circuitry FRDC and inside the second opening OP2 to protect the conductive bumps 524. In addition, the sensing region 522 of the chip 520 corresponds to the first opening OP1 of the fine redistribution circuitry FRDC to prevent the sensing region 522 from being shielded. It should be appreciated that although FIG. 6A merely shows one chip 520, the number of the chip 520 may be increased as needed, and the disclosure is not limited thereto.

For example, the image sensing unit 530 of the electronic device 500 is disposed on the substrate structure 510 and corresponds to the sensing region 522 of the chip 520. The image sensing unit 530 may include a frame 532, an actuating structure 534, and a light filter 536. The frame 532 may be disposed on the fine redistribution circuitry FRDC of the substrate structure 510. For example, the frame 532 and the chip 520 are respectively disposed on two opposite sides of the fine redistribution circuitry FRDC. In some embodiments, the frame 532 may be disposed on the fine dielectric layer FD of the fine redistribution circuitry FRDC by an adhesive (not shown).

The actuating structure 534 of the image sensing unit 530 may be disposed on the frame 532 and located above the chip 520. For example, the actuating structure 534 includes a lens carrier 534a and a lens element 534b movably disposed inside the lens carrier 534a. The lens carrier 534a may be fixed to the frame 532 by an adhesive (not shown). In some embodiments, the actuating structure 534 may be a voice coil motor (VCM) actuator and the lens element 534b may be composed of a plurality of optical lenses. The lens element 534b can be automatically adjusted by the VCM actuator to achieve the autofocus function, thereby obtaining a clear image. The light filter 536 may be disposed on the frame 532. In some embodiments, the frame 532 has a top opening 532a, and the light filter 536 may be disposed at the top opening 532a of the frame 532 and located between the chip 520 and the lens element 534b. For example, the top opening 532a of the frame 532 is enclosed by the light filter 536, thereby preventing foreign particles in the air from entering the frame 532 via the top opening 532a. In some embodiments, the light filter 536 may be a glass substrate that has a surface coated with an infrared (IR) blocking layer and/or an anti-reflection (AR) layer. For example, an image beam (not shown) may be projected to the sensing region 522 of the chip 520 via the lens element 534b and the light filter 536.

The electronic device 500 may further include an active electronic component 540, a passive electronic component 550, and an electrical connector 560. For example, the active electronic component 540 and the passive electronic component 550 may be disposed on the fine redistribution circuitry FRDC at the same side as the frame 532. That is, the active electronic component 540/the passive electronic component 550 and the chip 520 are disposed on two opposite sides of the fine redistribution circuitry FRDC, respectively. In some embodiments, the active electronic component 540 may be disposed aside the frame 532. The passive electronic component 550 may be disposed on the fine redistribution circuitry FRDC and surrounded by the frame 532. In some embodiments, the electronic device 500 may include a plurality of passive electronic components 550 that are disposed within the frame 532 and/or disposed outside of the frame 532 according to the design requirements. The passive electronic components 550 may be disposed between the frame 532 and the active electronic component 540. In other embodiments, the passive electronic components 550 may be disposed to surround the active electronic component 540, but the disclosure is not limited thereto. The active electronic component 540 may be a processing chip for signal processing, or may be a control chip, a logic chip, a power chip, a memory chip, etc. The passive electronic component 550 may be an inductor, a capacitor, a resistor, and/or the like.

In some embodiments, the electrical connector 560 may be disposed at the edge of the fine redistribution circuitry FRDC and may be disposed at the same side as the frame 532 and/or the active electronic component 540 and the passive electronic component 550. For example, the frame 532 and the electrical connector 560 may be disposed at two ends of the fine redistribution circuitry FRDC, respectively. The electrical connector 560 may be disposed on a portion of the fine redistribution circuitry FRDC where the fine redistribution circuitry FRDC is not overlapped with the coarse redistribution circuitry CRDC, and the fine redistribution circuitry FRDC may be bent in accordance with the design requirements. The electrical connector 560 is, for example, an electrical connector that is mounted onto the fine redistribution circuitry FRDC as an electrical connection to other external devices, or the electrical connector 560 is formed by a part of the fine redistribution circuitry FRDC as a golden finger contact electrically connected to other external devices. For example, the signals of the external device (not shown) may be transmitted to the chip 520 at least via the electrical connector 560 and the fine redistribution circuitry FRDC. It should be appreciated that the disclosure construes no limitation of the number of active electronic components 540, passive electronic components 550, and electrical connectors 560 that may be adjusted to the design requirements. By using the substrate structure 510 including the coarse redistribution circuitry CRDC and the fine redistribution circuitry FRDC, it is not necessary to provide additional interposers, thereby reducing the overall thickness of the electronic device 500.

Figure 7A:
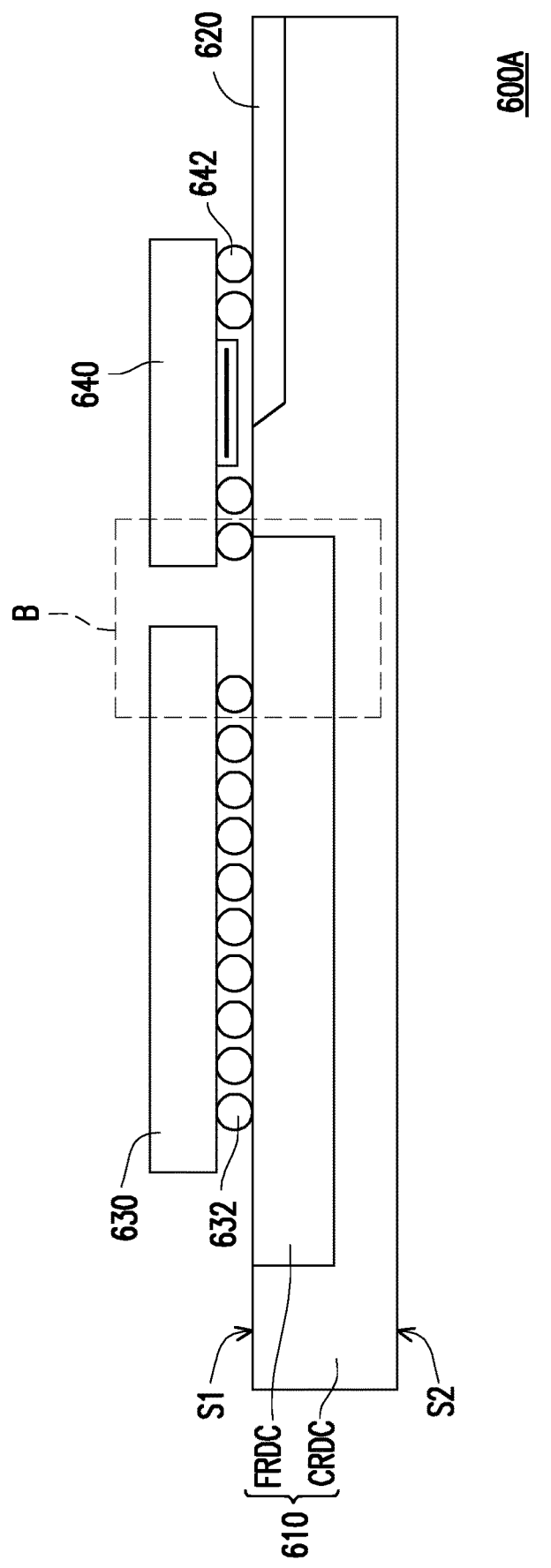
FIG. 7A is a schematic cross-sectional view of an electronic device in accordance with some embodiments of the present invention.
Figure 7B:
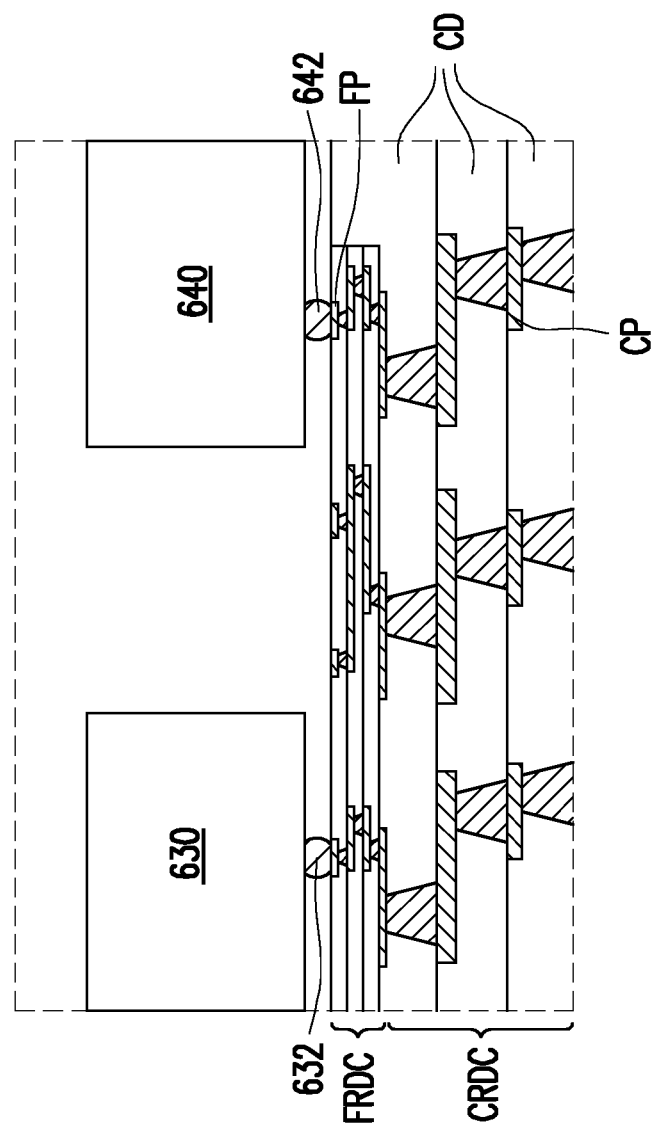
FIG. 7B is an enlarged schematic view of a region B in FIG. 7A.
Figure 7C:
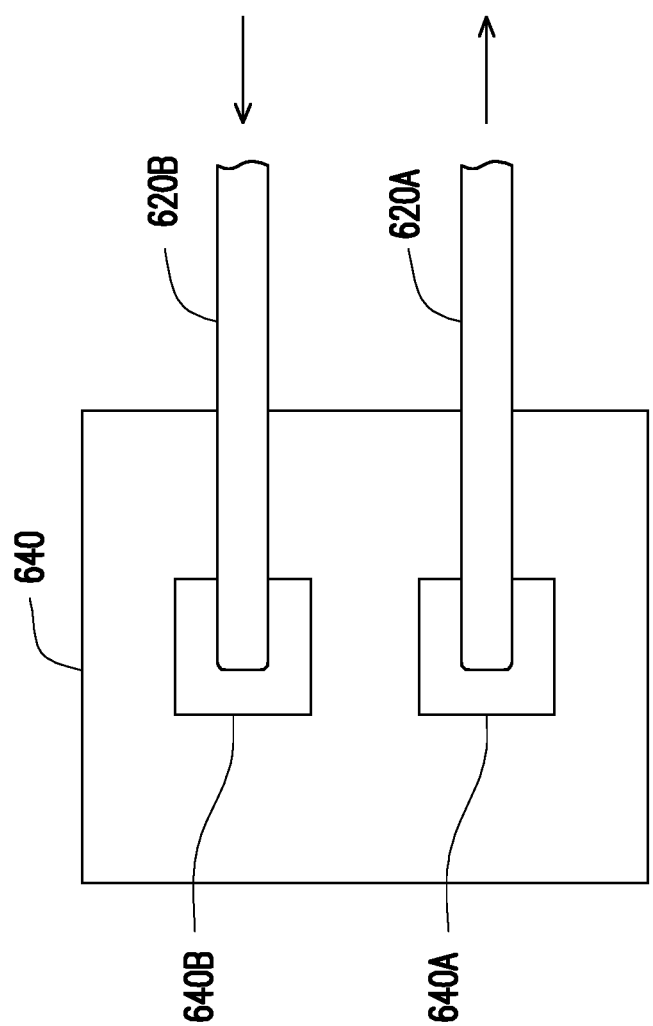
FIG. 7C is a schematic bottom view of the signal transmission component of FIG. 7A with respect to the conversion unit.

FIG. 7A is a schematic cross-sectional view of an electronic device in accordance with some embodiments of the present invention, FIG. 7B is an enlarged schematic view of a region B in FIG. 7A, and FIG. 7C is a schematic bottom view of the signal transmission component of FIG. 7A with respect to the conversion unit. Referring to FIG. 7A, FIG. 7B, and FIG. 7C, an electronic device 600A includes a substrate structure 610, a signal transmission component 620, a chip 630, and a conversion unit 640. The substrate structure 610 includes a coarse redistribution circuitry CRDC and a fine redistribution circuitry FRDC embedded in the coarse redistribution circuitry CRDC. For example, the substrate structure 610 has a first side S1 and a second side S2 opposite to the first side S1, and the fine redistribution circuitry FRDC may be disposed on the first side S1. The coarse redistribution circuitry CRDC includes the coarse conductive pattern CP and the fine redistribution circuitry FRDC includes the fine conductive pattern FP electrically connected to the coarse conductive pattern CP, where the layout density of the fine conductive pattern FP is denser than that of the coarse conductive pattern CP. For example, the fine redistribution circuitry FRDC is similar to the fine redistribution circuitry FRDC of the foregoing embodiments (as shown in FIG. 1B) and the coarse redistribution circuitry CRDC is similar to the first redistribution circuitry RDC1 of the foregoing embodiments (as shown in FIG. 1B), so the details will not be described again.

The signal transmission component 620 of the electronic device 600A is, for example, embedded at the first side S1 of the substrate structure 610. For example, the signal transmission component 620 may be disposed inside the coarse redistribution circuitry CRDC and located aside the fine redistribution circuitry FRDC. In some embodiments, the coarse dielectric layer CD in the coarse redistribution circuitry CRDC at least covers the bottom surface and the lateral surface of the signal transmission component 620. The top surface of the signal transmission component 620 may be exposed by the coarse dielectric layer CD or covered by the coarse dielectric layer CD. In other embodiments, the signal transmission component 620 may be embedded in the fine redistribution circuitry FRDC. For example, the signal transmission component 620 may include an optical fiber, and the signal transmission component 620 may include a protective layer covering the top surface to protect the core portion of the optical fiber. By embedding the optical fiber directly in the substrate structure 610, the manufacturing cost of requiring additional packaging of each optical fiber in a conventional process may be simplified. The chip 630 is, for example, disposed on the first side S1 of the substrate structure 610 and connected to the fine redistribution circuitry FRDC. For example, the chip 630 includes a plurality of conductive bumps 632 and the chip 630 may be mounted to the fine redistribution circuitry FRDC (also located on the first side S1) in a flip-chip manner. The chip 630 is, for example, a driver integrated circuit (IC) chip or a control chip, but the disclosure is not limited thereto. By embedding the fine redistribution circuitry FRDC and the signal transmission component 620 in the coarse redistribution circuitry CRDC, the substrate structure 610 may simultaneously transmit optical signals and electrical signals so that the chip 630 disposed on the substrate structure 610 may be capable of processing a greater amount of information. In other embodiments, the electronic device 600A further includes active electronic components and/or passive electronic components disposed on the substrate structure 610 and coupled to the chip 630 and the conversion unit 640, depending on actual needs, but the disclosure is not limited thereto.

The conversion unit 640 is disposed, for example, on the substrate structure 610 for converting between the optical signals and the electrical signals. In some embodiments, the conversion unit 640 is disposed on the first side S1 of the substrate structure 610 and located aside the chip 630. The conversion unit 640 may be coupled to the signal transmission component 620. For example, the conversion unit 640 has a plurality of connection terminals 642, a portion of the connection terminals 642 may be electrically connected to the fine conductive pattern FP of the fine redistribution circuitry FRDC, and another portion of the connection terminals 642 are electrically connected to the coarse conductive pattern CP of the coarse redistribution circuitry CRDC, such that the signals of the chip 630 may be transmitted to the conversion unit 640 via the fine redistribution circuitry FRDC so as to obtain a shorter signal transmission path, thereby improving the electrical performance of the electronic device 600A. In other embodiments, the connection terminals 642 of the conversion unit 640 may be entirely connected to the coarse conductive pattern CP. The chip 630 is electrically connected to the conversion unit 620 by the fine redistribution circuitry FRDC of the substrate structure 610, and the signals of the chip 630 are transmitted to the signal transmission component 620 via the conversion unit 620.

The conversion unit 640 of the electronic device 600A may convert the optical signals into the electrical signals and/or may convert the electrical signals into the optical signals, and transmit the electrical signals to the signal transmission component 620 and the fine redistribution circuitry FRDC of the substrate structure 610. For example, the signal transmission component 620 (e.g., an optical fiber) may transmit the optical signals to the conversion unit 640, the optical signals may be converted into the electrical signals by the conversion unit 640, and then the electrical signals may be transmitted to the chip 630 via the substrate structure 610. For example, the signal transmission component 620 may extend to other locations of the substrate structure 610 to connect other conversion units on the same substrate structure 610 (e.g., 640A, 640B of FIG. 7C). That is, the optical signals may be transmitted on the same substrate structure 610 via the signal transmission component 620. In some embodiments, the electronic device 600A includes a plurality of optical fibers 620A, 620B that are independent of one another. The electronic device 600A may also include more optical fibers for the purpose of high speed signal transmission.

In some embodiments, the conversion unit 640 may be an optical/electrical (OE) transceiver including a light emitting element 640A and a light receiving element 640B disposed aside the light emitting element 640A (as shown in FIG. 7C). For example, the light emitting element 640A and the light receiving element 640B are optically coupled to the signal transmitting elements 620A, 620B, respectively. The light emitting element 640A includes, for example, a laser, a Vertical Cavity Surface Emitting Laser (VCSEL), a light emitting diode, or the like. The light receiving element 640B may include a photodetector or other suitable optical components. By embedding a plurality of optical fibers 620A, 620B into the substrate structure 610, the signals enter into the optical fiber 620B (as indicated by the arrow in FIG. 7C) so as to be received by the light receiving element 640B, and the signals from the light emitting element 640A may be transmitted to other external devices via the optical fiber 620A (as indicated by the arrow in FIG. 7C). It should be appreciated that the signals of the electronic device 600A may be bidirectional transmission. In other embodiments, the signals of the electronic device may be transmitted in one-way manner.

Figure 8:
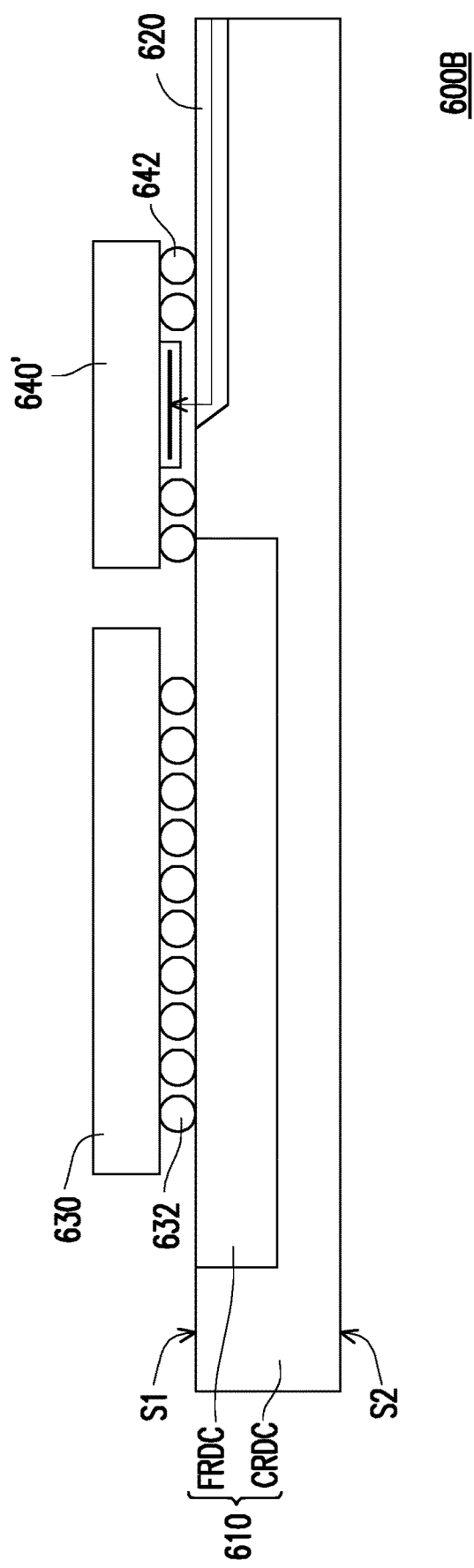
FIG. 8 is a schematic cross-sectional view of an electronic device in accordance with still another embodiment of the present invention.

FIG. 8 is a schematic cross-sectional view of an electronic device in accordance with still another embodiment of the present invention. The electronic device 600B of FIG. 8 is similar to the electronic device 600A of FIG. 7A, and the difference therebetween lies in that the conversion unit 640' of the electronic device 600B in FIG. 8 is an optical/electrical (OE) converter. The OE converter may convert the optical signals transmitted by the signal transmission component 620 (e.g., an optical fiber) into the electrical signals. For example, the conversion unit 640' includes a light receiving component. The signal transmission component 620 (e.g., an optical fiber) may transmit the optical signals to the light receiving component of the conversion unit 640', and the optical signals may be converted into the electrical signals by the conversion unit 640'. The converted electrical signals may be transmitted to the chip 630 at least by the fine redistribution circuitry FRDC of the substrate structure 610.

Figure 9:
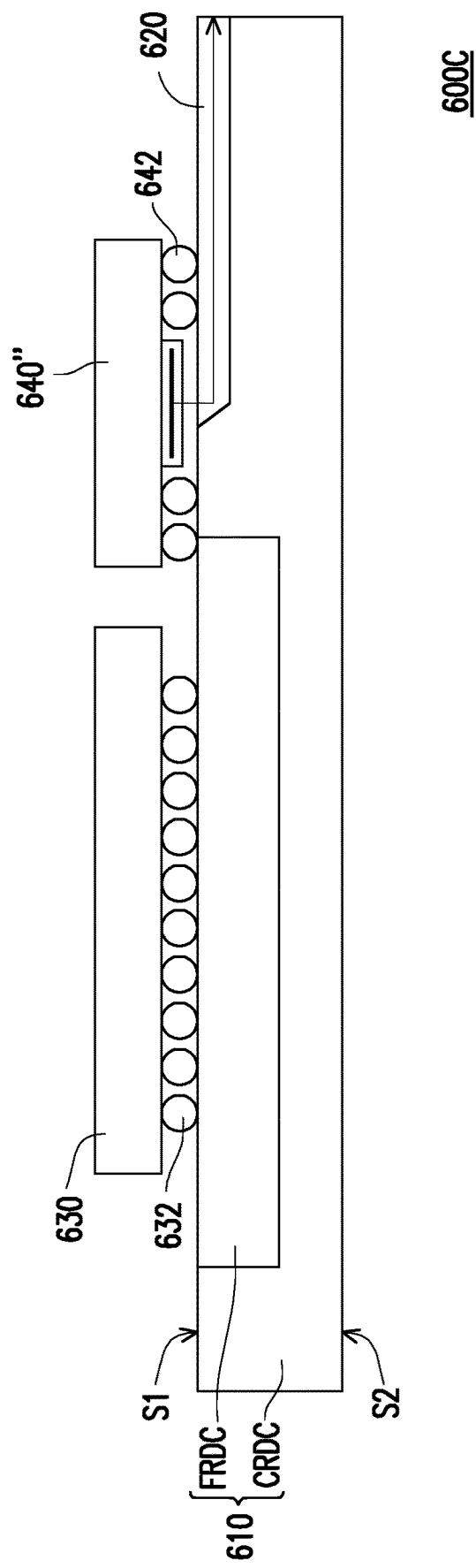
FIG. 9 is a schematic cross-sectional view of an electronic device in accordance with still another embodiment of the present invention.

FIG. 9 is a schematic cross-sectional view of an electronic device in accordance with still another embodiment of the present invention. The electronic device 600C of FIG. 9 is similar to the electronic device 600A of FIG. 7A, the difference therebetween lies in that the conversion unit 640" of the electronic device 600C of FIG. 9 is an electrical/optical (EO) converter. The EO converter may convert the electrical signals into the optical signals and then output the signals to the signal transmission component 620. For example, the conversion unit 640" includes a light emitting element, and the electrical signals of the chip 630 may be converted into the optical signals by the conversion unit 640". Therefore, the converted optical signals may be transmitted to the signal transmission component 620 via the light emitting component and further to be transmitted to other external devices.

Based on the above, the first portion of the substrate structure of the disclosure includes a fine redistribution layer and a coarse redistribution layer, so that a chip including high density contacts can be directly mounted on the fine redistribution layer without disposing additional interposers. Accordingly, the thickness of the overall structure may be reduced. The substrate structure is connected between the first portion and the second portion using a flexible intermediate portion, so that the substrate structure may be adapted to different configuration requirements of various products, thereby reducing manufacturing costs. In addition, an electronic device of the disclosure includes a substrate structure similar to that described above, and the sensing chip is disposed inside the substrate structure and directly connected to the fine redistribution layer of the substrate structure, so that no additional interposer is required, thereby reducing the thickness of the electronic device. Furthermore, other active/passive electronic components may be disposed on the fine redistribution layer of the substrate structure, so that the electronic device may be designed to be light, thin, and short. Another electronic device of the disclosure includes a substrate structure similar to the above, and the substrate structure of the electronic device may simultaneously transmit the optical signals and the electrical signals by embedding the fine redistribution layer and the signals transmission component in the coarse redistribution layer, so that the chip(s) disposed on the substrate structure may be capable of processing a greater amount of information.

It will be apparent to those skilled in the art that various modifications and variations can be made to the structure of the disclosure without departing from the scope or spirit of the invention. In view of the foregoing, it is intended that the cover modifications and variations of this invention provided they fall within the scope of the following claims and their equivalents.

What is claimed is:

1. A substrate structure, comprising:
    a first portion, comprising:
        a first fine redistribution layer, comprising a first fine conductive pattern; and
        a first coarse redistribution layer, disposed on the first fine redistribution layer, electrically connected to the first fine redistribution layer, and comprising a first coarse conductive pattern electrically connected to the first fine redistribution layer, wherein a layout density of the first fine conductive pattern is denser than a layout density of the first coarse conductive pattern;
    a second portion, comprising at least one of a second fine redistribution layer and a second coarse redistribution layer; and
    an intermediate portion, disposed between the first portion and the second portion and electrically connected to the first portion and the second portion, wherein the intermediate portion is a flexible circuit board, a first end of the intermediate portion is connected to the first portion, and a second end of the intermediate portion opposite to the first end is connected to the second portion.

2. The substrate structure according to claim 1, wherein the second portion comprises:
    the second fine redistribution layer, comprising a second fine conductive pattern; and
    the second coarse redistribution layer, disposed on the second fine redistribution layer and comprising a second coarse conductive pattern electrically connected to the second fine conductive pattern, wherein a layout density of the second fine conductive pattern is denser than a layout density of the second coarse conductive pattern.

3. The substrate structure according to claim 1, wherein the substrate structure is adapted to be connected to an electronic component and the intermediate portion comprises a signal transmission component to transmit a signal emitted by the electronic component.

4. The substrate structure according to claim 1, wherein the first fine redistribution layer further comprises a first fine conductive via, the first coarse redistribution layer further comprises a first coarse conductive via, the first fine conductive via and the first coarse conductive via are respectively disposed on two opposite sides of the first fine conductive pattern of the first fine redistribution layer.

5. The substrate structure according to claim 4, wherein at least one of an outer diameter of the first fine conductive via of the first fine redistribution layer and an outer diameter of the first coarse conductive via of the first coarse redistribution layer is tapered toward a direction.

6. The substrate structure according to claim 4, wherein an outer diameter of the first fine conductive via of the first fine redistribution layer and an outer diameter of the first coarse conductive via of the first coarse redistribution layer are tapered toward the same direction.

7. The substrate structure according to claim 1, wherein the first portion further comprises:
a core, disposed on the first coarse redistribution layer opposite to the first fine redistribution layer, and electrically connected to the first coarse conductive pattern, wherein a Young's modulus of the core is greater than a Young's modulus of the first coarse redistribution layer.

8. An electronic device, comprising:
a substrate structure, comprising:
a fine redistribution layer, having a first opening and comprising a fine conductive pattern; and
a coarse redistribution layer, having a second opening in communication with the first opening, disposed on the fine redistribution layer, electrically connected to the fine redistribution layer, and comprising a coarse conductive pattern electrically connected to the fine conductive pattern, wherein a layout density of the fine conductive pattern is denser than a layout density of the coarse conductive pattern, and the second opening of the coarse redistribution layer exposes at least a portion of the fine redistribution layer;
a chip, comprising a sensing region, disposed in the second opening of the coarse redistribution layer and electrically connected to at least the portion of the fine redistribution layer exposed by the second opening, wherein the first opening of the fine redistribution layer exposes the sensing region of the chip; and
an image sensing unit, disposed on the substrate structure and corresponding to the sensing region of the chip.

9. The electronic device according to claim 8, wherein the image sensing unit comprises:
a frame, disposed on the substrate structure, wherein the frame and the chip are respectively disposed on two opposite sides of the fine redistribution layer;
an actuating structure, disposed on the frame and above the chip, comprising a lens carrier and a lens element movably disposed in the lens carrier; and
a light filter, disposed on the frame and located between the chip and the lens element.

10. The electronic device according to claim 8, wherein the fine redistribution layer of the substrate structure further comprises a fine conductive via, the coarse redistribution layer further comprises a coarse conductive via, and the fine conductive via and the coarse conductive via are respectively disposed at two opposite sides of the fine conductive pattern of the fine redistribution layer.

11. The electronic device according to claim 10, wherein at least one of an outer diameter of the fine conductive via of the fine redistribution layer of the substrate structure and an outer diameter of the coarse conductive via of the coarse redistribution layer of the substrate structure is tapered toward a direction.

12. The electronic device according to claim 10, wherein an outer diameter of the fine conductive via of the fine redistribution layer of the substrate structure and an outer diameter of the coarse conductive via of the coarse redistribution layer are tapered toward the same direction.

13. The electronic device according to claim 8, wherein a thickness of the fine redistribution layer of the substrate structure is thinner than a thickness of the coarse redistribution layer, and the fine redistribution layer extends outwardly from an edge of the coarse redistribution layer.

14. An electronic device, comprising:
a substrate structure, comprising:
a coarse redistribution layer, comprising a coarse conductive pattern; and
a fine redistribution layer, embedded in the coarse redistribution layer, comprising a fine conductive pattern electrically connected to the coarse conductive pattern, wherein a layout density of the fine conductive pattern is denser than a layout density of the coarse conductive pattern;
a signal transmission component, embedded in the substrate structure;
a chip, disposed on the substrate structure and connected to the fine redistribution layer; and
a conversion unit, disposed on the substrate structure, located aside the chip, and coupled to the signal transmission component, wherein the chip is electrically connected to the conversion unit via the fine redistribution layer of the substrate structure, a first signal of the chip is transmitted to the signal transmission component via the conversion unit and/or a second signal of the signal transmission component is transmitted to the chip via the conversion unit.

15. The electronic device according to claim 14, wherein the electronic device comprises a plurality of the signal transmission components, the first signal is an electrical signal and the second signal is an optical signal, the conversion unit is configured to convert between the optical signal and the electrical signal, and the conversion unit comprises:
a light emitting element, optically coupled to one of the signal transmission components; and
a light receiving element, disposed aside the light emitting element and optically coupled to another one of the signal transmitting components.

16. The electronic device according to claim 14, wherein the fine redistribution layer of the substrate structure further comprises a fine conductive via, the coarse redistribution layer further comprises a coarse conductive via, and the fine conductive via and the coarse conductive via are respectively disposed at two opposite sides of the fine conductive pattern of the fine redistribution layer.

17. The electronic device according to claim 16, wherein at least one of an outer diameter of the fine conductive via of the fine redistribution layer of the substrate structure and an outer diameter of the coarse conductive via of the coarse redistribution layer is tapered toward a direction.

18. The electronic device according to claim 16, wherein an outer diameter of the fine conductive via of the fine redistribution layer of the substrate structure and an outer diameter of the coarse conductive via of the coarse redistribution layer are tapered toward the same direction.

* * * * *